United States Patent [19]

Boram

[11] Patent Number: 4,641,241
[45] Date of Patent: Feb. 3, 1987

[54] MEMORY CARTRIDGE FOR ELECTRONIC VOTING SYSTEM

[75] Inventor: Robert J. Boram, Quakertown, Pa.

[73] Assignee: R. F. Shoup Corporation, Bryn Mawr, Pa.

[21] Appl. No.: 608,159

[22] Filed: May 8, 1984

[51] Int. Cl.$^4$ .................. G06F 15/20; G07C 13/00
[52] U.S. Cl. ..................... 364/409; 434/306; 235/54 F; 235/51; 235/50 R; 235/56
[58] Field of Search ............ 364/409; 434/306; 235/51, 50 R, 50 A, 50 B, 54 R, 54 A, 54 B, 54 C, 54 D, 54 E, 54 F, 56

[56] References Cited

U.S. PATENT DOCUMENTS

| | | | |
|---|---|---|---|
| 3,648,022 | 3/1972 | Cook | 235/61.9 R |
| 3,743,177 | 7/1973 | Martin et al. | 235/51 |
| 3,941,976 | 3/1976 | Huhn | 235/54 F |
| 3,947,669 | 3/1976 | Simmons et al. | 364/409 X |
| 4,015,106 | 3/1977 | De Phillipo | 235/54 F |
| 4,021,780 | 5/1977 | Narey et al. | 235/54 F X |
| 4,025,757 | 5/1977 | McKay et al. | 235/54 F |
| 4,046,992 | 9/1977 | Huhn et al. | 235/54 F |
| 4,066,871 | 1/1978 | Cason, Sr. et al. | 235/54 F |
| 4,178,501 | 12/1979 | Luther | 235/54 F |
| 4,227,643 | 10/1980 | Luther | 235/54 F |
| 4,345,315 | 8/1982 | Cadotte et al. | 235/54 F X |

Primary Examiner—Gary V. Harkcom
Attorney, Agent, or Firm—Woodcock Washburn Kurtz Mackiewicz & Norris

[57] ABSTRACT

A memory cartridge for use in connection with an electronic voting system features read only memories which carry signals from a computer at an election headquarters to a programmable voting machine prior to an election, and bring the results of the election to election headquarters. The cartridge comprises electrically erasable read only memory for carrying running totals of the votes cast for various candidates, and non-electrically erasable programmable read only memory for carrying the final results. The memories are sealed in an unbreakable cartridge housing and a fuse is provided in series with the WRITE ENABLE line of the non-electrically erasable programmable read only memory which is blown at the conclusion of voting.

6 Claims, 2 Drawing Figures

MEMORY CARTRIDGE FOR ELECTRONIC VOTING SYSTEM

FIELD OF THE INVENTION

This invention relates to electronic voting systems. More particularly, this invention relates to a memory cartridge for effective election results storage and communication between a programmable computer device located at an election headquarters and a programmable voting device located at a polling place.

BACKGROUND OF THE INVENTION

For many years it has been conventional to carry out elections for candidates for public office in the United States and other countries by voting carried out on mechanical voting machines which retain tallies of the votes cast for particular candidates and output the results in a useful fashion at the conclusion of voting. This approach is not without utility and has been very popular. However, to replace prior art mechanical voting machines with similar devices would fail to take advantage of recent developments in electronic technology, most particularly in digital computers and the like. In particular a need exists in the art for a programmable electronic voting machine which is provided to election officials and which is thereafter programmed by them for use in connection with a particular election in a particular precinct. Desirably this would be done in such a way that the overall cost of the system to the municipality would be minimized yet in which the results would be achieved efficiently and with a high degree of security of the electoral process and in a convenient manner. Copending application Ser. No. 608,157, filed May 8, 1984 provides such a machine and voting system. Communication between a computer operated by election officials at an election headquarters and a programmable voting machine at a polling place is required to set up the voting machine for a particular election. Desirably this would also be accomplished without use of wire connections. Similarly, the election results must be communicated back to the election headquarters. Desirably this would also be accomplished without connecting wires, and in a way which effectively prevents tampering with the election results.

OBJECTS OF THE INVENTION

It is therefore an object of the invention to provide a memory cartridge which serves to carry information from a computer device at an election headquarters to a voting machine at a polling place which serves to personalize the latter for use in connection with a particular election and ballot paper layout.

It is a further object of the invention to provide a memory cartridge which carries the information as described above and also carries the result of the election back to the election headquarters from the polling place at the conclusion of the election.

It is a further object of the invention to provide a memory cartridge which maintains a running total of the votes cast for each candidate during the election such that in the event of destruction, damage to or malfunction of the programmable voting machine, the memory cartridge contains the summary of the results at that point for use in totalization.

SUMMARY OF THE INVENTION

The above needs of the art and objects of the invention are met by the present invention which comprises a memory cartridge containing programmable read only memory.

Copending Ser. No. 608,157 filed May 8, 1984 calls for an electronic voting machine and system. The present application relates to one particular element of that system, a memory cartridge which is programmed by a computer device at an election headquarters and which is then physically supplied together with a suitable ballot paper to a programmable voting machine at a polling place. The memory cartridge of the invention is inserted into the programmable voting machine and supplies the data required to set it up for the election. In particular, the memory cartridge carries signals which identify to processor means comprised in the programmable voting machine which of an array of switches on the face of the programmable voting machine are to be associated with which candidates, as well as legal restrictions on voting and the like. The indication of switches corresponds to the paper ballot which is affixed to the programmable voting machine. During the election the memory cartridge is enabled to store running totals of the votes cast for each candidate for office. At the end of the election, the votes cast for each candidate are copied to the memory cartridge for supplying the totals to the computer for totaling. Means for ensuring that this portion of the memory cartridge is not tampered with are actuated. The memory cartridge can then be used to transport the results of the election back to election headquarters for totaling together with those received from other voting machines.

In a preferred embodiment the memory cartridge according to the invention comprises three read only memories, two of which are electrically erasable read only memory (EEROM) and a third of which is non-electrically erasable read only memory (EPROM). All the ROM's are contained in a sealed housing which cannot be opened without detection. The non-electrically erasable memory or EPROM has a fuse in series with its WRITE ENABLE line which is blown by the programmable voting machine after the election results have been copied thereto, so as to ensure that no further alterations of the data contained in the EPROM is possible. The other two read only memories are electrically erasable read only memories and their contents are updated as each voter votes. In this way they keep a running total which is compared to comparable data stored in the central processing unit comprised by the programmable voting machine according to the invention. A mathematically generated checksum, determined by the election results contained in the EPROM, is generated by the electronic voting machine and stored in the memory cartridge. A similar such checksum is generated by the election headquarters computer, determined in accordance with the voting machine programming instructions, and is stored in the memory cartridge.

BRIEF DESCRIPTION OF THE DRAWINGS

The invention will be better understood if reference is made to the accompanying drawings in which.

DESCRIPTION OF THE PREFERRED EMBODIMENTS

Figure 1:
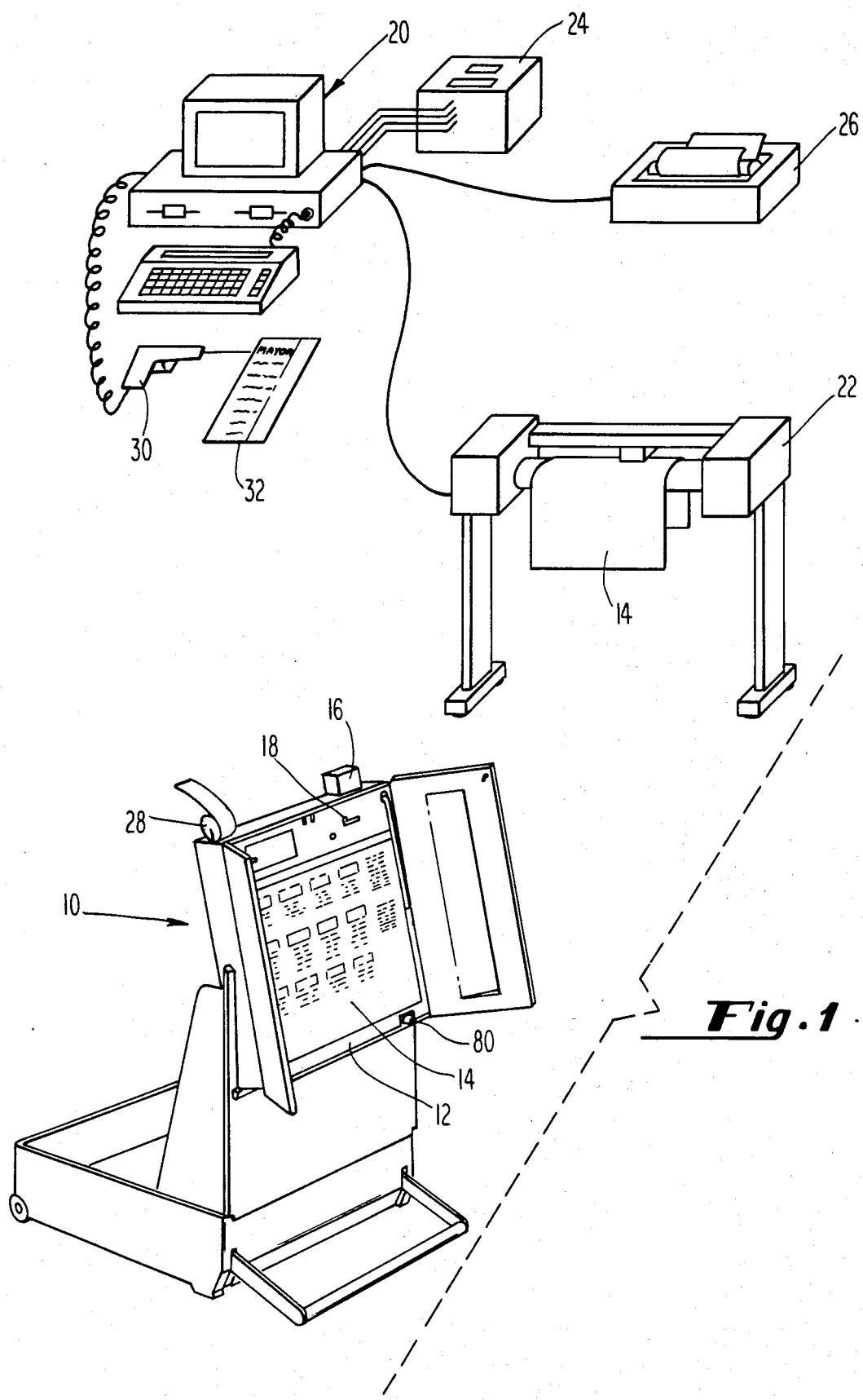
FIG. 1 shows an overall view of the system of the invention.

FIG. 1 shows an overall view of the electronic voting system according to the invention as more fully detailed and claimed in copending application Ser. No. 608,158 filed May 8, 1984 incorporated herein by reference. An electronic voting machine 10 comprises a planar array 12 of push button type switches which are overlayed by a paper ballot 14. The paper ballot and a covering protective layer of clear plastic are sufficiently flexible that the individual voting switches of the array 12 can be depressed through the paper and the plastic. The voting machine is supplied in an unprogrammed state and is "programmed" or "set up" for a particular election by supply thereto of a memory cartridge 16 which is programmed by a computer 20 operated by election officials with signals which effectively associate individual ones of the switches with individual candidates, and by supply thereto of a paper ballot 14 printed correspondingly to identify the switches with the candidates. The voting machine may also comprise a printer 28 for outputting a visible record of the tallies of the election at its conclusion.

As mentioned, the voting system of the invention further comprises a personal computer or other computing device 20 which is operated by the election officials by inputting election data including the names of the candidates, their corresponding offices and any legal restrictions on voting. The IBM "PC" personal computer is a suitable unit. The computer 20 can generate a draft ballot copy on a printer 26 and then generates a paper ballot 14 on the ballot printer 22. Memory cartridge 16 comprises an erasable programmable read only memory (EPROM) and is generated by the computer 20 operating a conventional EPROM programmer/reader 24.

According to the invention of copending Ser. No. 608,158 filed May 8, 1984 now abandoned, and its continuation Ser. No. 770,053, filed Aug. 27, 1985, both of which are incorporated herein by reference, an absentee ballot 32 which comprises bar code candidate and office identification is read by a conventional bar code reader 30. In this way absentee ballots are readily inputted into the computer system. Votes cast on the electronic voting machine are tallied on the memory cartridge 16, which is reinserted into the EPROM programmer/reader 24 for input thereof to the computer system 20.

Figure 2:
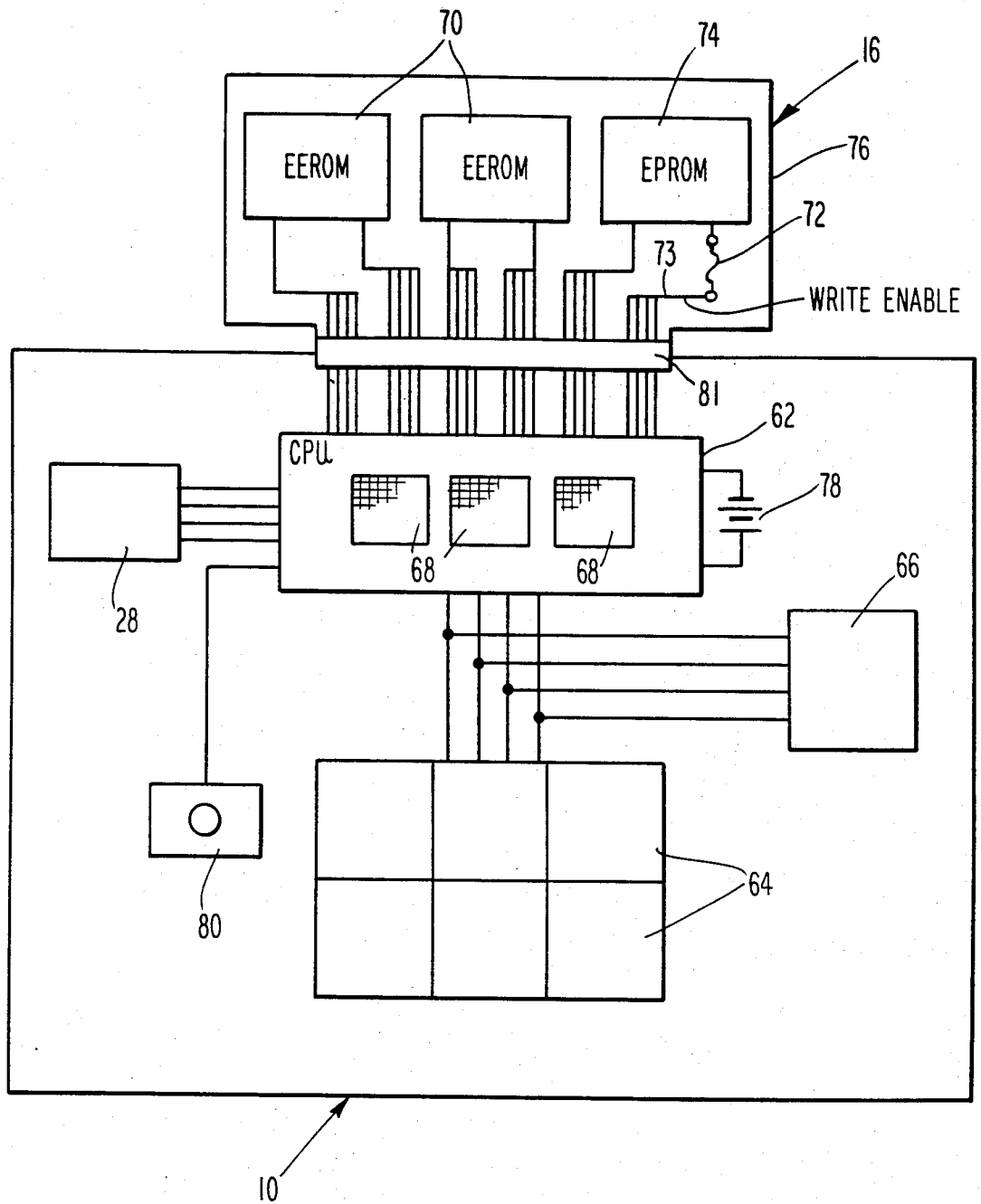
FIG. 2 shows a more detailed view of the electronic voting machine and of the memory cartridge of the invention.

FIG. 2 shows the important components of the programmable voting machine 10 and of the memory cartridge 16. The programmable voting machine 10 comprises a central processing unit 62 which in the preferred embodiment is a Hitachi HD 6303P microprocessor with supporting hardware, which as will be understood by those skilled in the art is a custom metal-oxide-semiconductor (CMOS) version of the 6801 microprocessor.

Connected to the CPU 62 is an operator console panel 66 which is operated by an election official. For example, in a primary election the official typically inputs each voter's party registration, Democrat, Republican or other. This is connected to the same memory bus line as are six "matrix modules" 64 which together make up the switches which are depressed by the voters in voting. These are overlayed by the ballot paper 14 of FIG. 1 in order to indicate to the voters the names of the candidates corresponding to the switches of the matrix module 64. Also connected to the CPU is the printer 28 also shown in FIG. 1, and a battery 78 which is used to maintain the contents of the memory registers of the CPU 62 should power be lost or disconnected.

The CPU 62 comprises three substantially identical memory arrays 68. These are used to store three identical copies of the tallies of the votes cast for each candidate in the voting process. After selection of desired candidates, each voter votes by pressing a vote button 80, which causes the votes selected by a voter's pressing individual switches of the memory matrix 64 to be copied to the storage registers 68. Thereafter the contents of each register of all three of the memory arrays 68 are compared to one another. Any discrepancies cause the CPU 62 to cease operation of the electronic voting machine and to provide an error code. The results of the election stored up to that point in the memory arrays 68 can be printed then on the printer 28 so that the previous votes are not lost. After this has been performed, the identical contents of these three arrays 68 are copied to one of the two electrically erasable ROM's (EEROM's) 70 comprised in the memory cartridge 60. After this the contents of the first EEROM are compared to the contents of the three registers 68. If these are in agreement then the contents of memory arrays 68 are copied to the second EEROM and the comparison is again made. In this way the election officials can be assured that the running totals found in the registers 70 and in the registers 68 are accurate after each and every voter. Hence all that is required in order to provide a secure election system is that the system shut itself down if a an uncorrectable error—e.g., if any of the registers 68 or registers 70 should disagree—is found, and this is easily accomplished under software control of the CPU 62. An appropriate indication can then be provided on the operator console 66 and a technician called, the machine taken out of service permanently, or the like.

As will be understood by those skilled in the art, the EEROM's are effectively erased when the vote tallies are updated by CPU 62. Also comprised in the memory cartridge 16 is an erasable programmable read only memory (EPROM) which is not erasable by the CPU 62 as are the EEROM's. Instead, once data has been written to the registers of the EPROM 74 it can only be erased by exposure to ultraviolet light. Therefore by enclosing the two EEROM's 70 and the EPROM's 74 in a sealed, light-opaque case 76, the election officials can be assured that the contents of the EPROM can only be written to once. Accordingly, at the conclusion of an election, when the contents of the EEROM's and of the memory register 68 of the CPU 62 are confirmed to be equal, they are copied to the EPROM 74. A checksum is generated, as well understood in the art, and written to the EPROM. As well understood by those skilled in the art, data is written to a ROM by placing it on data signal lines, by placing an address on address lines and by supplying a pulse to a WRITE ENABLE line. After confirmation, a fuse 72 in series with the WRITE ENABLE line 73 running to the EPROM is blown by application thereto by the CPU of a burst of current. Accordingly, no further writing to the EPROM 74 is possible thereafter until the housing 76 has been opened, which requires detectable breaking of a seal on the housing 76, the fuse 72 replaced and the EPROM 74 erased by exposure thereof to ultraviolet light. Accordingly, once the fuse 72 has been blown the memory cartridge 16 can simply be carried back to election headquarters where its contents can be read by the PROM programmer/reader 24, supplied to computer 20 and used in totalization of the election results. If on the other hand the memory cartridge 16 should be lost in transit, or if verification of the checksum should result in an error indication, the fact that the battery 78 causes the data stored in the memory 68 of the CPU 62 to be preserved allows this data to be recovered at least until the CPU is reinitialized for a subsequent election by election officials.

Those skilled in the art will recognize that there has been described a memory cartridge for use in connection with an electronic voting system which provides a number of advantages and features not found in any prior art mechanical machine. The use of a sealed cartridge containing a read only memory which can only be written to by the voting machine at the polling place and which is thereafter disabled from further writing by the blowing of the fuse offers an unparallelled degree of election security. By enclosing this memory in a sealed cartridge, the accurate transit of the votes from the polling place to election headquarters can be rendered substantially secure at least to the extent that any tampering with the results is readily detectable either by a broken seal or through failure of the stored checksum. Similarly, carrying of the signals setting up the voting machine from the election headquarters to the polling place in the memory cartridge itself greatly simplifies the setting up of the voting machine. Again, the fact that the housing is tamper proof and the checksum is provided means that there is substantially no opportunity for fraud to enter into the process of setting up the voting machine. The relatively sophisticated nature of the computer based election system means that a remarkably high degree of sophistication would be required to tamper with the machine without rendering it totally inoperable, which effectively prevents fraud.

While a preferred embodiment of the invention has been described, the scope of the invention is not limited thereby but only by the following claims. In particular, while the invention has been described as implemented using two EEROM's 70, it would be possible to simply use two "pages" of storage locations in a single chip; in fact this is done in the preferred embodiment, using a Seeq Corp. Model DE 5213 EEROM. The EPROM 74 may be the commonly available Model 2764. Other modifications and improvements are within the skill of the art.

What is claimed is:

1. A programmable memory cartridge for use in connection with an electronic election system, said system comprising:
    computer means for receiving data concerning candidates, their respective offices and legal restrictions on voting therefor; and
    programmable voting machine means, said programmable voting machine means being programmed by supply thereto of said memory cartridge;
    said programmable memory cartridge comprising solid state memory data storage means and being adapted to be electrically connected to said computer means for receipt and storage of data and adapted to be connected to said programmable voting machine means for supply of said data thereto so as to program said programmable voting machine means;
    wherein said solid state memory data storage means comprises means for storage of data received from said computer means for supply to said programmable voting machine means, for adapting said programmable voting machine means for use in connection with a particular election, means for storage of election results received from said programmable voting machine means and supply thereof to said computer means for tabulation of the results of the election and means for storing running totals of the votes tallied in connection with a given election, in addition to memory means for storage of the final results output by said voting machine upon conclusion of an election;
    wherein said running totals are stored in an electrically erasable read only memory and the final results of said election are stored in a non-electrically erasable read only memory.

2. The cartridge of claim 1 further comprising means for ensuring that the final results of an election can only be written into said non-electrically erasable read only memory at the conclusion of said election and cannot be altered thereafter.

3. The cartridge of claim 2 wherein said means for ensuring that the final results written into said non-electrically erasable read only memory cannot be altered comprise:
    a fuse in series with a signal line connected to said non-electrically erasable read only memory,
    said signal line carrying the WRITE ENABLE signal from said programmable voting machine means to said electrically erasable read only memory, said signal used to cause said read only memory to store data therein,
    whereby said programmable voting machine means is enabled to blow said fuse after storing data in said non-electrically erasable read only memory, so that said data cannot be subsequently altered.

4. The cartridge of claim 3 wherein said non-electrically erasable read only memory is an ultraviolet light erasable read only memory.

5. The cartridge of claim 4 wherein said read only memories are contained within a sealed case which must be opened in a detectable manner in order to permit erasure of said ultraviolet light erasable read only memory.

6. The cartridge of claim 1 further comprising means for storage of checksum data for verification of said election results.

* * * * *